(12) United States Patent
Guo et al.

(10) Patent No.: US 11,094,703 B1
(45) Date of Patent: Aug. 17, 2021

(54) SEMICONDUCTOR PLUG HAVING AN ETCH-RESISTANT LAYER IN THREE-DIMENSIONAL MEMORY DEVICES

(71) Applicant: YANGTZE MEMORY TECHNOLOGIES CO., LTD., Wuhan (CN)

(72) Inventors: Haifeng Guo, Wuhan (CN); Xiaojin Wang, Wuhan (CN); Chengxing Yu, Wuhan (CN); Lin Lai, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/860,913

(22) Filed: Apr. 28, 2020

Related U.S. Application Data

(63) Continuation of application No. PCT/CN2020/074601, filed on Feb. 10, 2020.

(51) Int. Cl.
| | |
|---|---|
| *G11C 11/00* | (2006.01) |
| *H01L 27/11514* | (2017.01) |
| *H01L 27/108* | (2006.01) |
| *H01L 27/11582* | (2017.01) |

(52) U.S. Cl.
CPC .. *H01L 27/11514* (2013.01); *H01L 27/10855* (2013.01); *H01L 27/11582* (2013.01)

(58) Field of Classification Search
CPC ......... H01L 27/11514; H01L 27/10855; H01L 11/582
See application file for complete search history.

(56) References Cited

U.S. PATENT DOCUMENTS

| | | | | |
|---|---|---|---|---|
| 9,530,785 | B1* | 12/2016 | Koka | H01L 27/11556 |
| 9,613,975 | B2* | 4/2017 | Huang | H01L 27/1157 |
| 10,679,985 | B2* | 6/2020 | Liu | H01L 29/1037 |
| 10,892,023 | B2* | 1/2021 | Wang | H01L 27/11582 |
| 2016/0293621 | A1 | 10/2016 | Huang et al. | |

FOREIGN PATENT DOCUMENTS

| | | |
|---|---|---|
| CN | 108010835 A | 5/2018 |
| CN | 109417074 A | 3/2019 |
| CN | 109417076 A | 3/2019 |

OTHER PUBLICATIONS

International Search Report issued in corresponding International Application No. PCT/CN2020/074601, dated Nov. 16, 2020, 4 pages.

* cited by examiner

*Primary Examiner* — Pho M Luu
(74) *Attorney, Agent, or Firm* — Bayes PLLC

(57) ABSTRACT

3D memory devices with an etch-resistant layer and methods for forming the same are disclosed. A memory device includes a substrate and a memory stack disposed on the substrate. The memory stack includes a plurality of interleaved conductor layers and dielectric layers. The memory device also includes a plurality of memory strings each extending vertically through the memory stack and including a semiconductor plug at a bottom portion of the memory string. The semiconductor plug is in contact with the substrate and includes a top portion doped with an etch-resistant material.

20 Claims, 16 Drawing Sheets

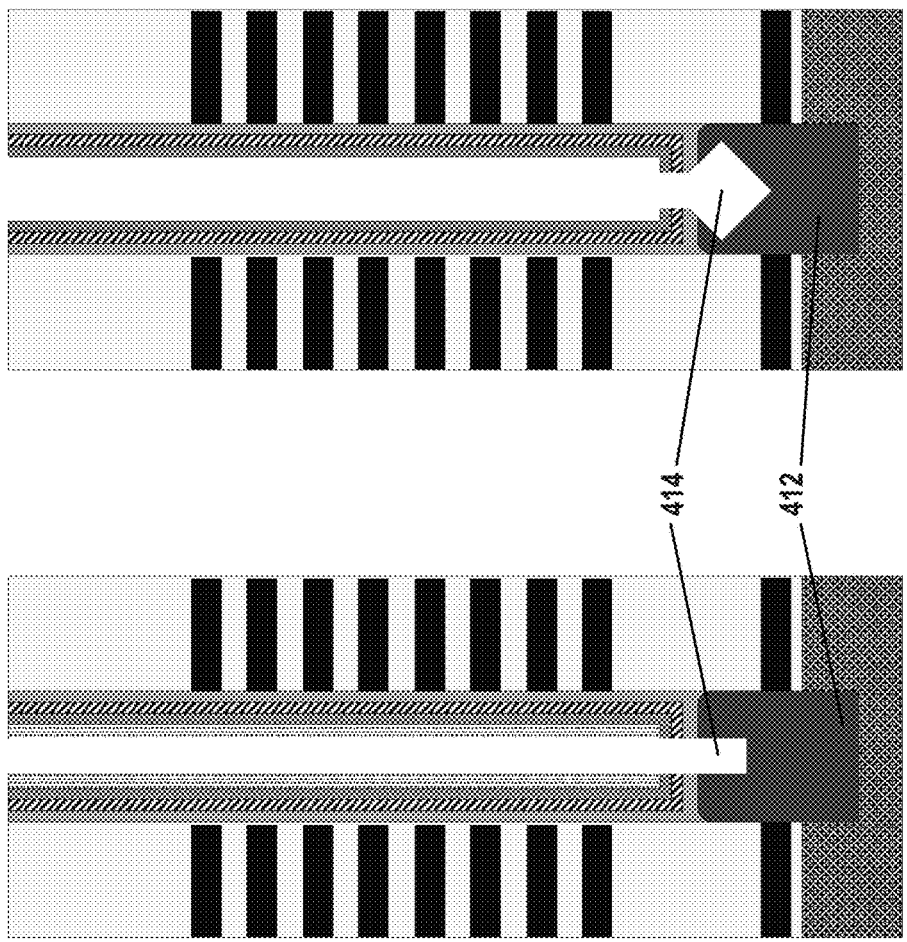
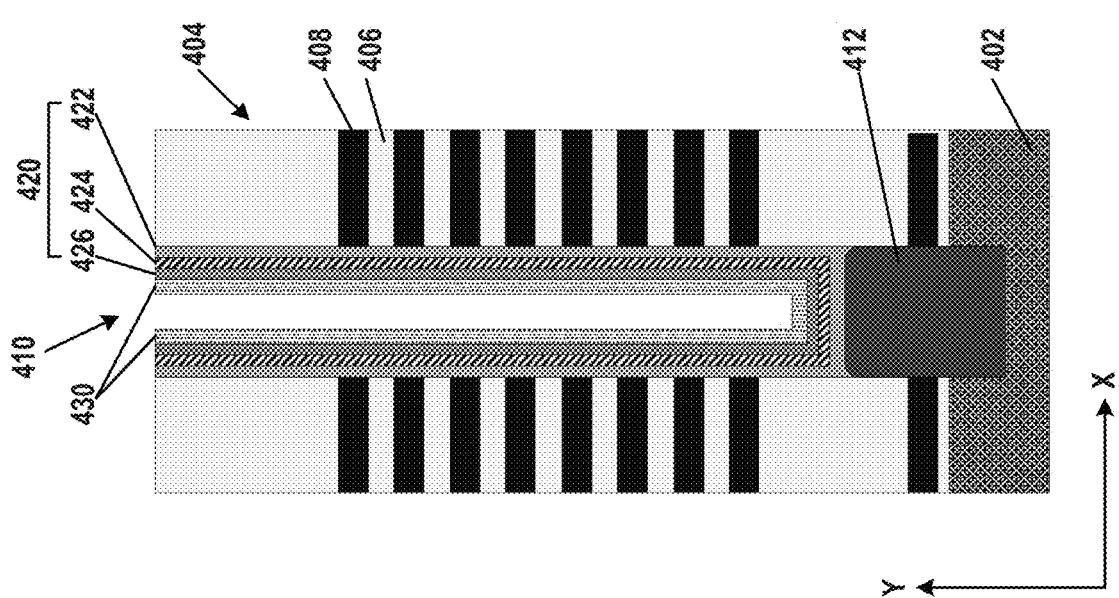
FIG. 4A  FIG. 4B  FIG. 4C

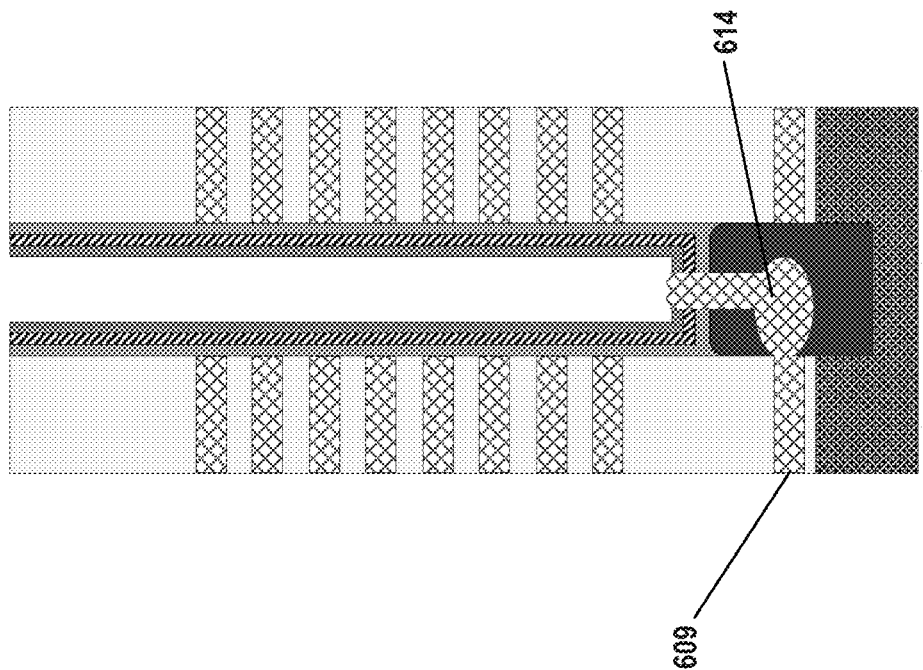
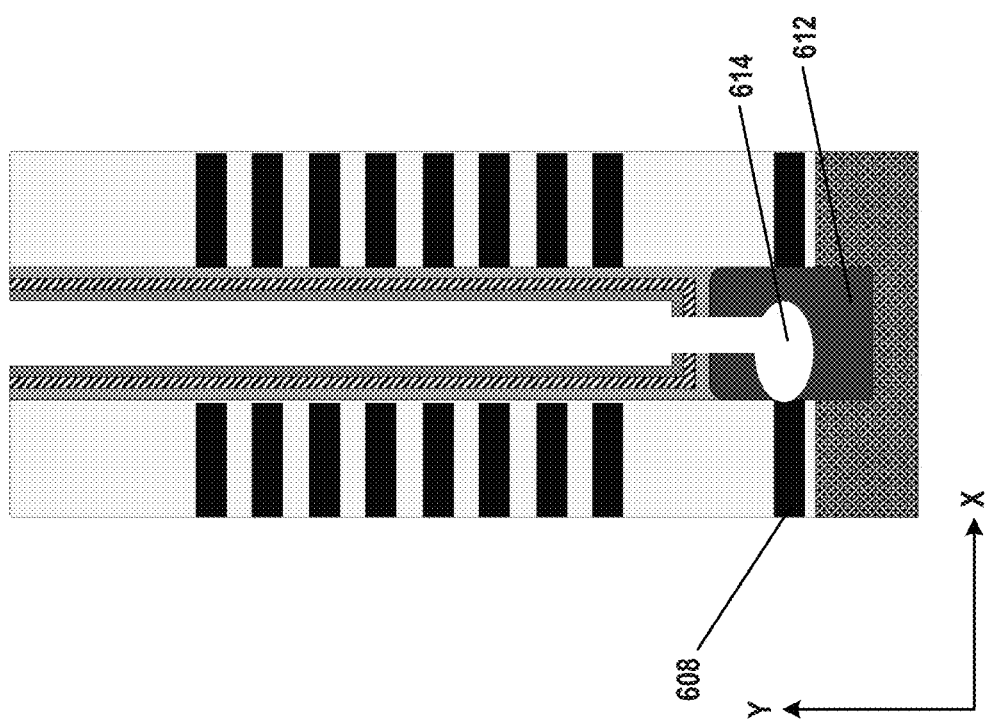
FIG. 6A
FIG. 6B

SEMICONDUCTOR PLUG HAVING AN ETCH-RESISTANT LAYER IN THREE-DIMENSIONAL MEMORY DEVICES

CROSS-REFERENCE TO RELATED APPLICATIONS

This application is continuation of International Application No. PCT/CN2020/074601, filed on Feb. 10, 2020, entitled "SEMICONDUCTOR PLUG HAVING AN ETCH-RESISTANT LAYER IN THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with an etch-resistant layer for reducing material loss in a semiconductor plug during fabrication and methods for forming the same are disclosed herein.

In one example, a 3D memory device is provided. The memory device includes a substrate and a memory stack disposed on the substrate. The memory stack includes a plurality of interleaved conductor layers and dielectric layers. The memory device also includes a plurality of memory strings each extending vertically through the memory stack and including a semiconductor plug at a bottom portion of the memory string. The semiconductor plug is in contact with the substrate and includes a top portion doped with an etch-resistant material.

In another example, a method for forming a 3D memory device is provided. The method includes forming a dielectric stack on a substrate. The dielectric stack includes a plurality of interleaved dielectric layers and sacrificial layers. The method also includes forming an opening extending vertically through the dielectric stack to reach the substrate. The method also includes forming a semiconductor plug at a lower portion of the opening. The semiconductor plug is in contact with the substrate. The method further includes forming an etch-resistant layer at a top portion of the semiconductor plug. In addition, the method includes forming a channel structure in the opening. The channel structure is in contact with the etch-resistant layer of the semiconductor plug. Moreover, the method includes forming a memory stack including a plurality of interleaved dielectric layers and conductor layers by replacing the sacrificial layers in the dielectric stack with the conductor layers.

In still another example, a method for forming a semiconductor structure is provided. The method includes forming a plurality of interleaved dielectric layers and sacrificial layers on a substrate. The method also includes forming an opening extending vertically through the interleaved dielectric layers and sacrificial layers. The method also includes forming a semiconductor plug at a lower portion of the opening. The semiconductor plug is in contact with the substrate. The method further includes doping a top portion of the semiconductor plug with an etch-resistant material. In addition, the method includes forming a channel structure in the opening. The channel structure extends into the top portion of the semiconductor plug.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4A-4C illustrate exemplary fabrication processes for forming a channel structure according to conventional methods.

FIGS. 6A and 6B illustrate an exemplary short circuit scenario due to excessive material loss in a semiconductor plug.

Figure 1:
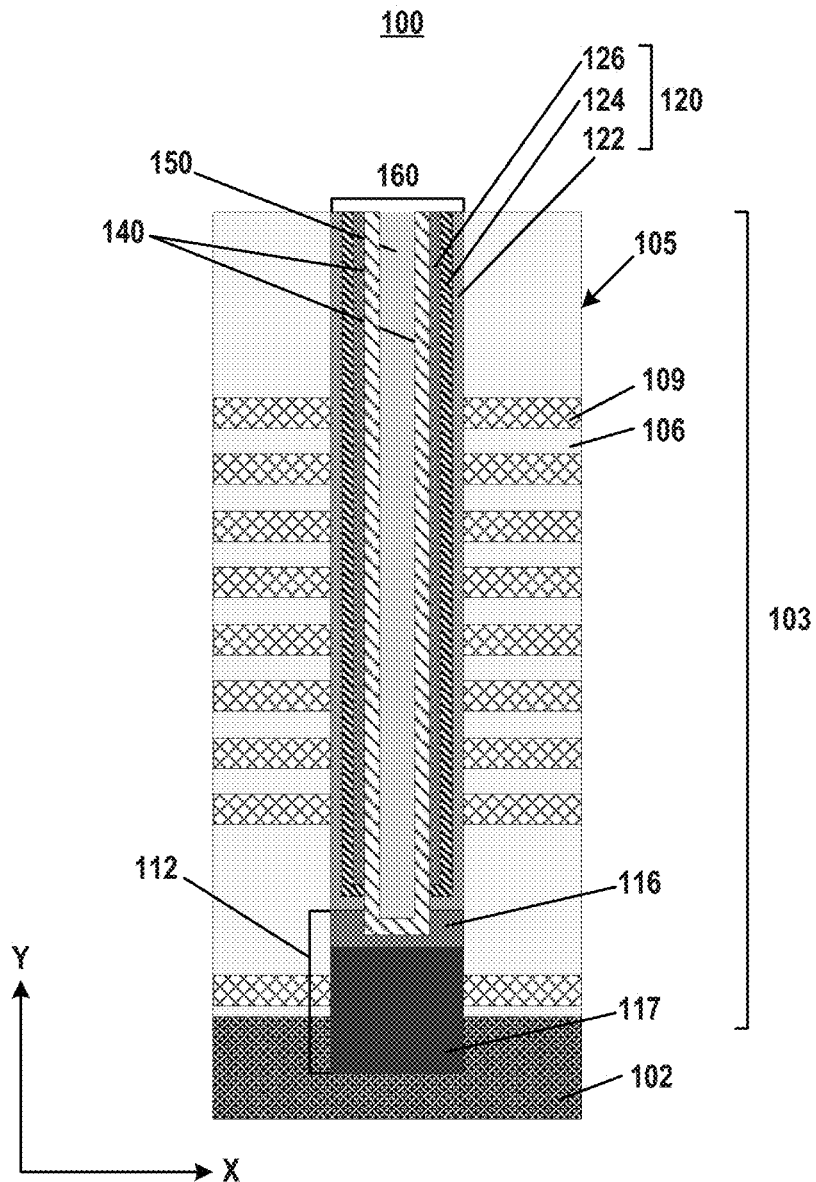
FIG. 1 illustrates an exemplary 3D memory device having an etch-resistant layer for reducing material loss in a semiconductor plug, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string. The semiconductor plug acts as a channel of a transistor when combined with a gate conductor layer formed surrounding it. The semiconductor plug can be formed through a selective epitaxial growth (SEG) process, in which the semiconductor plug is epitaxially grown from a substrate in an opening extending through a dielectric stack. A semiconductor plug formed through the SEG process is also referred to as an SEG plug.

After the semiconductor plug is formed, a channel structure can be formed in the opening above and in contact with the semiconductor plug. FIGS. 4A-4C illustrate exemplary fabrication processes for forming the channel structure. In FIGS. 4A-4C, the x axis is the lateral direction that is parallel to the wafer surface, while the y axis is the vertical direction that is perpendicular to the wafer surface. FIG. 4A shows a dielectric stack 404 on a substrate 402. Dielectric stack 404 includes a plurality of interleaved dielectric layers 406 and sacrificial layers 408. A semiconductor plug 412 is formed through epitaxial growth from substrate 402 in an opening 410 extending through dielectric stack 404. A memory film 420 is formed on top of semiconductor plug 412. Memory film 420 includes a silicon oxide layer 422, a silicon nitride layer 424, and another silicon oxide layer 426 (e.g., an "ONO" structure). An amorphous silicon (A-Si) layer 430 is formed inside the space surrounded by memory film 420 and along the sidewall of memory film 420. A-Si layer 430 is used as a protective layer to protect memory film 420 during a dry etching or punching process shown in FIG. 4B, as well as a sacrificial layer that is later removed by, for example, a wet etching process. In FIG. 4B, an etching process (e.g., a dry etching process) or punching process is performed to form an opening 414 extending through the bottom portions of A-Si layer 430 and memory film 420 to reach semiconductor plug 412. Some of the A-Si may be etched away during this process but memory film 420 is protected. In FIG. 4C, another etching process (e.g., a wet etching process) is performed to remove the remaining portion of A-Si layer 430. Due to the relatively low selectivity between A-Si and the material of semiconductor plug 412 (e.g., single crystalline silicon), the etching solution (e.g., ammonium hydroxide ($NH_4OH$)) used in the etching process may etch away an excess amount of the material of semiconductor plug 412 in order to remove all of the remaining A-Si, as shown by a relatively large void 414 within semiconductor plug 412 in FIG. 4C. On the other hand, to limit the loss of the material of semiconductor plug 412, A-Si residues may be present, which may adversely affect the deposition of other semiconductor material(s), such as polysilicon, in subsequent fabrication processes. It is challenging to balance between excess amounts of A-Si residues and excess amounts of material loss in semiconductor plug 412.

Figure 5A:
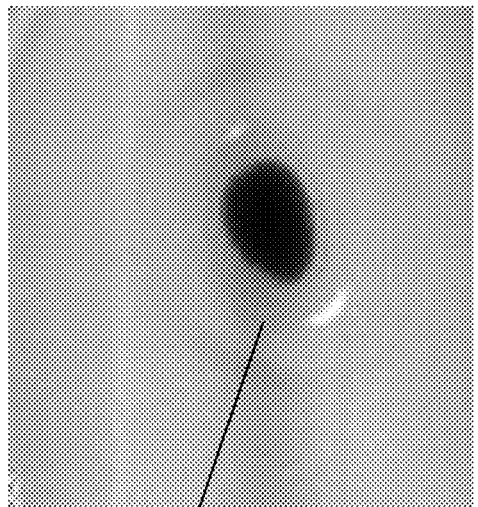
FIGS. 5A and 5B show images of exemplary amorphous silicon residues due to insufficient etching.
Figure 5B:
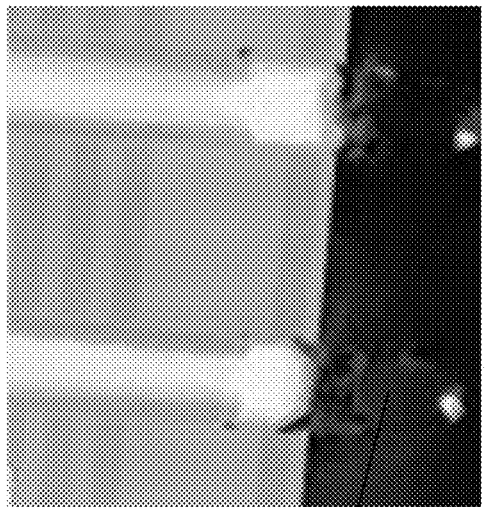
Figure 5C:
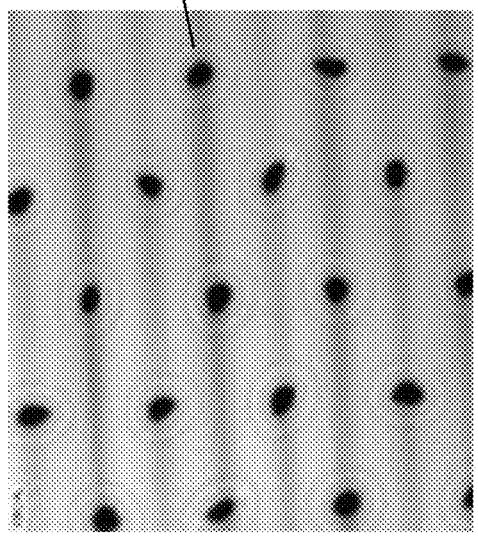
FIGS. 5C and 5D show images of exemplary semiconductor plugs in a core region and in a dummy region, respectively.
Figure 5D:
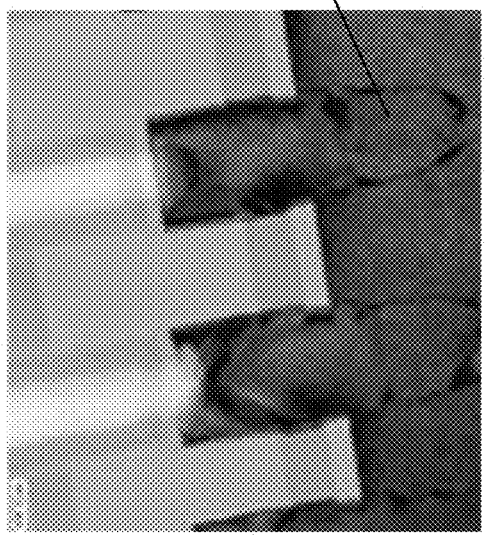

FIGS. 5A and 5B show images of exemplary A-Si residues 510 (top views) due to insufficient etching. Such A-Si residues may be present in core regions where memory strings are located and/or dummy regions where dummy structures are located to provide support and balance to the 3D memory device. FIG. 5C shows an image of exemplary semiconductor plugs in a core region (cross-sectional view), where the material loss in semiconductor plugs 502 is not significant due to a relatively small critical dimension in the core region. FIG. 5D shows an image of exemplary semiconductor plugs in a dummy region (cross-sectional view), where the material loss in semiconductor plugs 502' is significant due to a relatively large critical dimension in the dummy region.

Figure 7A:
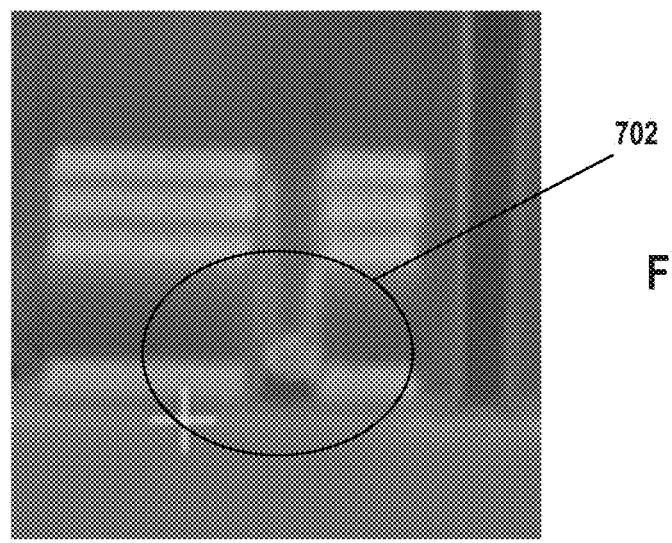
FIGS. 7A-7C show images of exemplary short-circuit scenarios.
Figure 7B:
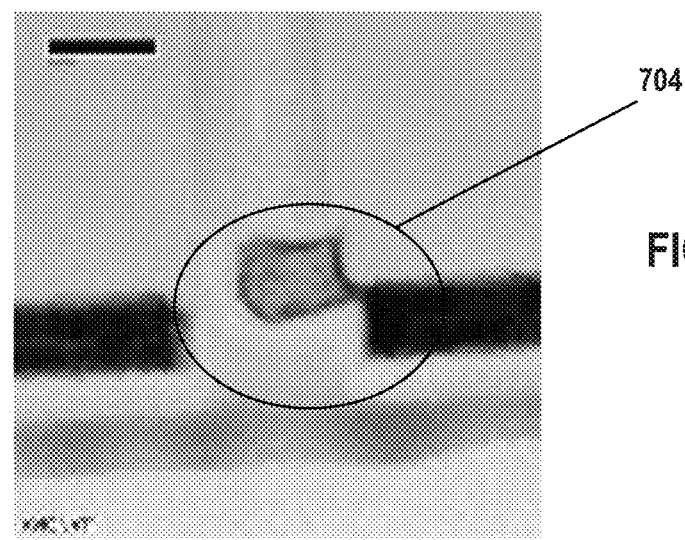
Figure 7C:
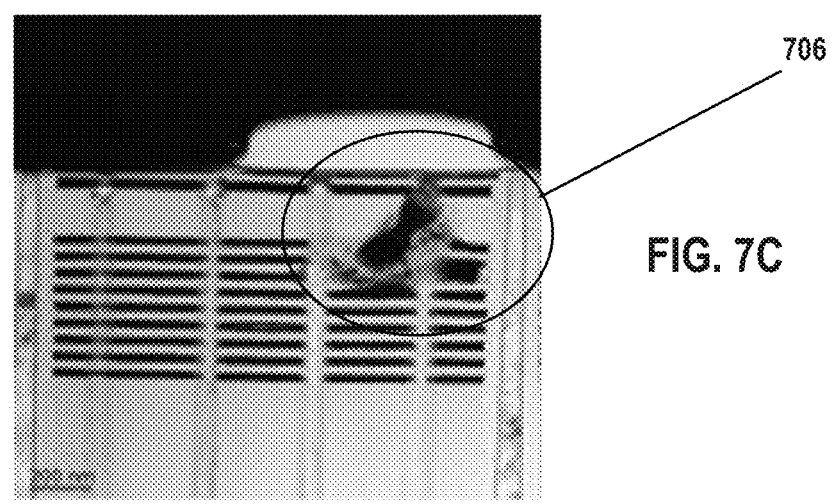

Excessive loss of material in the semiconductor plug may cause various problems, such as a short circuit between a semiconductor channel and a conductor layer located nearby. FIGS. 6A and 6B illustrate such an exemplary short circuit scenario. The x-y axes in FIGS. 6A and 6B are the same as those in FIGS. 4A-4C. FIG. 6A shows a semiconductor plug 612 having a large portion etched away during the etching process for removing A-Si, leaving a large opening 614 that extends through the sidewall of semiconductor plug 612 and reaches the nearby sacrificial layer 608. During the subsequent gate replacement process, conductor materials such as metal are filled into space previously occupied by sacrificial layer 608 to become a conductor layer 609 (FIG. 6B), thereby inevitably flowing into opening 614 and causing a short circuit. FIGS. 7A-7C are images showing exemplary short-circuit cases 702, 704, and 706 in sample memory devices, respectively. These short-circuit cases can cause performance issues or even device failures. Therefore, it is desirable to reduce the material loss in semiconductor plugs during the etching process that removes A-Si to address the above-discussed issues.

Embodiments in accordance with the present disclosure provide 3D memory devices having an etch-resistant layer for reducing material loss in a semiconductor plug and fabrication methods of such 3D memory devices. An etch-resistant layer may be formed at the top portion of the semiconductor plug by doping the portion with an etch-resistant material, such as carbon. The etch-resistant layer can prevent the etching solution used for removing A-Si from etching through the etch-resistant layer, thereby retaining the integrity of the remaining portion of the semiconductor plug underneath the etch-resistant layer during the etching process. The above-noted drawbacks caused by the excessive material loss in semiconductor plugs can thus be overcome, and the yield and reliability of the 3D memory devices can be improved. In addition, instead of using silicon to form the semiconductor plug, other semiconductor materials with high carrier mobility, such as silicon-germanium (SiGe), may be used to improve the carrier mobility, thereby further enhancing the performance of the 3D memory devices.

FIG. 1 illustrates an exemplary 3D memory device 100 having an etch-resistant layer for reducing material loss in a semiconductor plug, according to some embodiments of the present disclosure. As shown in FIG. 1, memory device 100 may include a substrate 102 and a cell stack 103. Substrate 102 may include silicon or other suitable semiconductor materials. Cell stack 103 may include a memory stack 105 and a memory string 160. Memory stack 105 may be disposed on substrate 102 and include a plurality of interleaved conductor layers 109 and dielectric layers 106. Conductor layers 109 can include conductive materials including, not limited to, W, Co, Cu, Al, polysilicon, silicides, or any combination thereof. Dielectric layers 106 may include dielectric materials such as silicon oxide.

It is noted that x and y axes are included in FIG. 1 to further illustrate the spatial relationship of the components in 3D memory device 100. Substrate 102 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

Memory string 160 may extend vertically through memory stack 105 and be in contact with substrate 102. In some embodiments, memory string 160 may be in contact with substrate 102 by extending into substrate 102, as schematically shown in FIG. 1. In some embodiments, memory string 160 may be in contact with substrate 102 at the top surface of substrate 102. Memory string 160 may include a semiconductor plug 112 at a bottom portion of the memory string. Semiconductor plug 112 may be the part of memory string 160 that is in contact with substrate 102 by either extending into substrate 102 or reaching at the top surface of substrate 102, as discussed above. Semiconductor plug 112 may include two portions. The top portion 116 may be doped with an etch-resistant material (also referred to as an etch-resistant layer 116) to reduce material loss during an etching process. The bottom portion 117 may not be doped with the etch-resistant material, but it is protected by the top portion from being etched away because the etching solution cannot etch through etch-resistant layer 116 and thus cannot reach bottom portion 117.

In some embodiments, semiconductor plug 112 may be an SEG plug formed through an SEG process. For example, semiconductor plug 112 may include silicon (e.g., single crystalline silicon) or other semiconductor materials having a matching crystal structure to that of substrate 102. In another example, semiconductor plug 112 may include silicon-germanium (SiGe), for example, by adding germanium into epitaxially grown silicon to form a SiGe plug. SiGe plug may improve carrier mobility, thereby improving the performance of 3D memory device 100. Etch-resistant layer 116 may include the same semiconductor material(s) as bottom portion 117 but with one or more additional etch-resistant materials doped therein. For example, the etch-resistant material may include carbon. In another example, doping of the etch-resistant material may cause etch-resistant layer 116 to have an etch rate much slower than that of A-Si, thereby increasing the selectivity during the etching process for removing A-Si. For instance, the etch rate of A-Si may be at least 30 times higher than the etch rate of etch-resistant layer 116 during the etching process. In still another example, when ammonium hydroxide ($NH_4OH$) is used as an etching solution, the etch rate of etch-resistant layer 116 may be less than 3 nanometer per minute under room temperature. The etch-resistant material can be implanted into the top portion of semiconductor plug 112 through an implantation process to form etch-resistant layer 116.

Memory string 160 may include a semiconductor channel 140 extending vertically through the interleaved conductor layers 109 and dielectric layers 106. Semiconductor channel 140 may extend into etch-resistant layer 116, as shown in FIG. 1. In some embodiments, semiconductor channel 140 may include polysilicon. In some embodiments, a dielectric material 150 (e.g., silicon oxide) may fill the space in semiconductor channel 140.

Memory string 160 may also include a memory film 120 disposed laterally between semiconductor channel 140 and the interleaved conductor layers 109 and dielectric layers 106. Memory film 120 may be a composite dielectric layer, such as a combination of a tunneling layer 126, a storage layer 124, and a blocking layer 122. Each layer in memory film 120 can include dielectric materials including, but not limited to, silicon oxide, silicon nitride, silicon oxynitride, or any combination thereof.

In some embodiments, 3D memory device 100 may include a plurality of memory strings 100, each having the same structure, as discussed above in connection with FIG. 1.

Figure 2A:
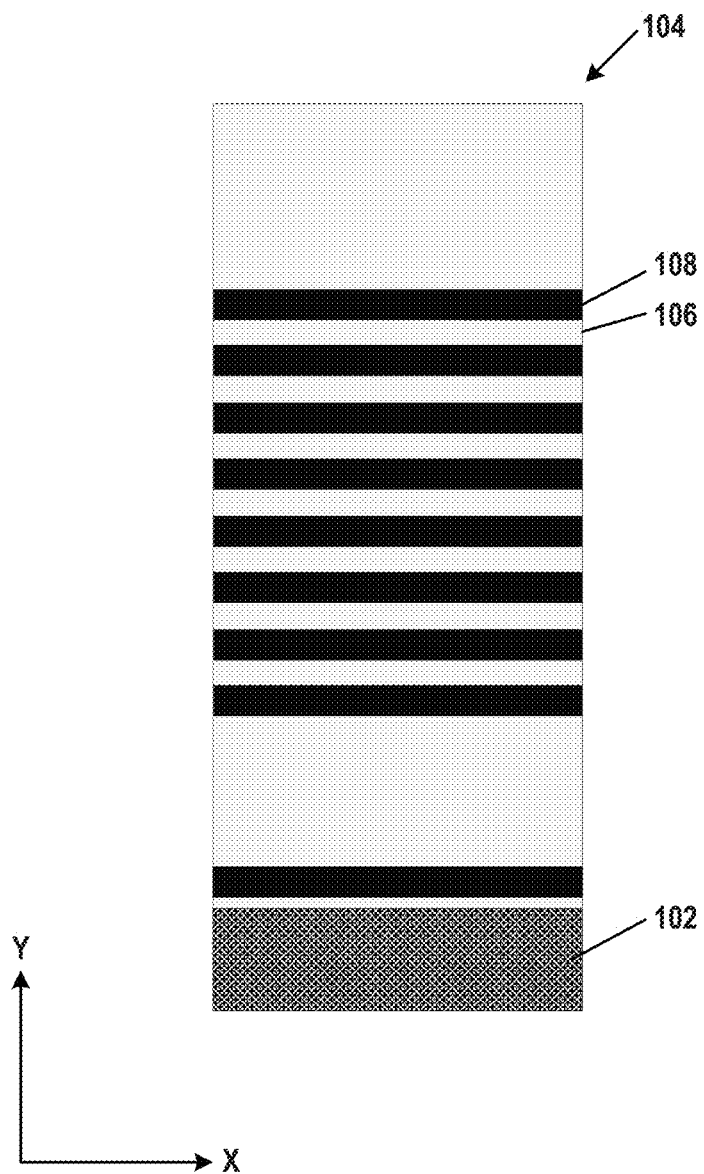
FIGS. 2A-2I illustrate an exemplary fabrication process for forming a 3D memory device having an etch-resistant layer for reducing material loss in a semiconductor plug, according to some embodiments of the present disclosure.
Figure 2B:
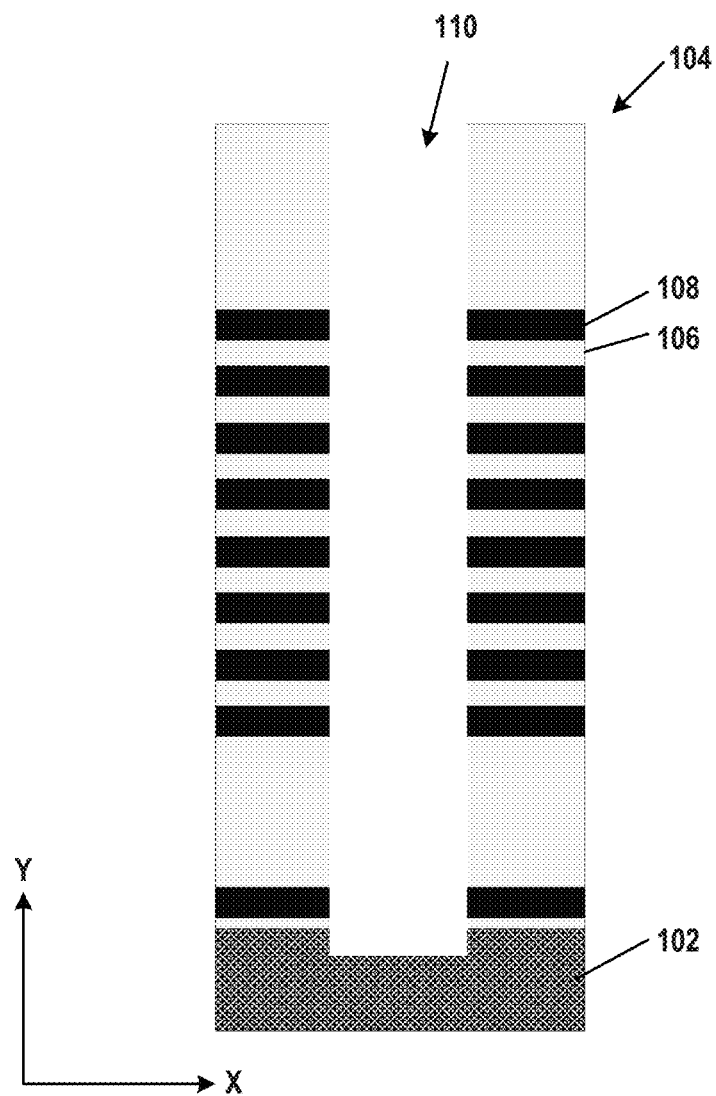
Figure 2C:
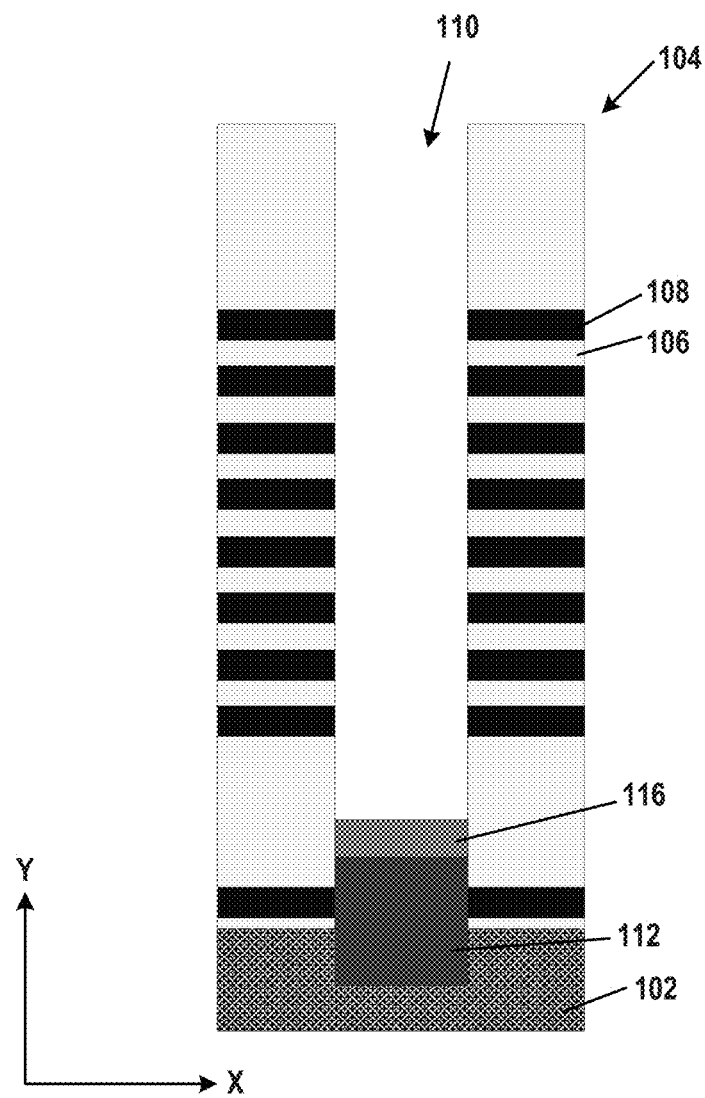
Figure 2D:
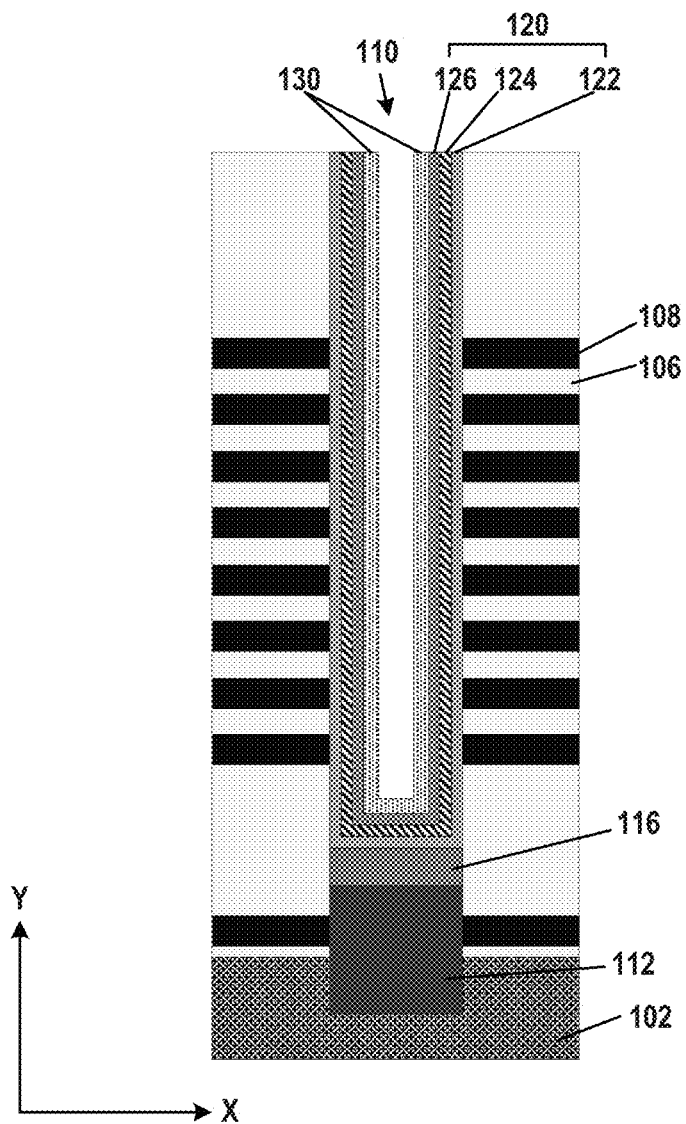
Figure 2E:
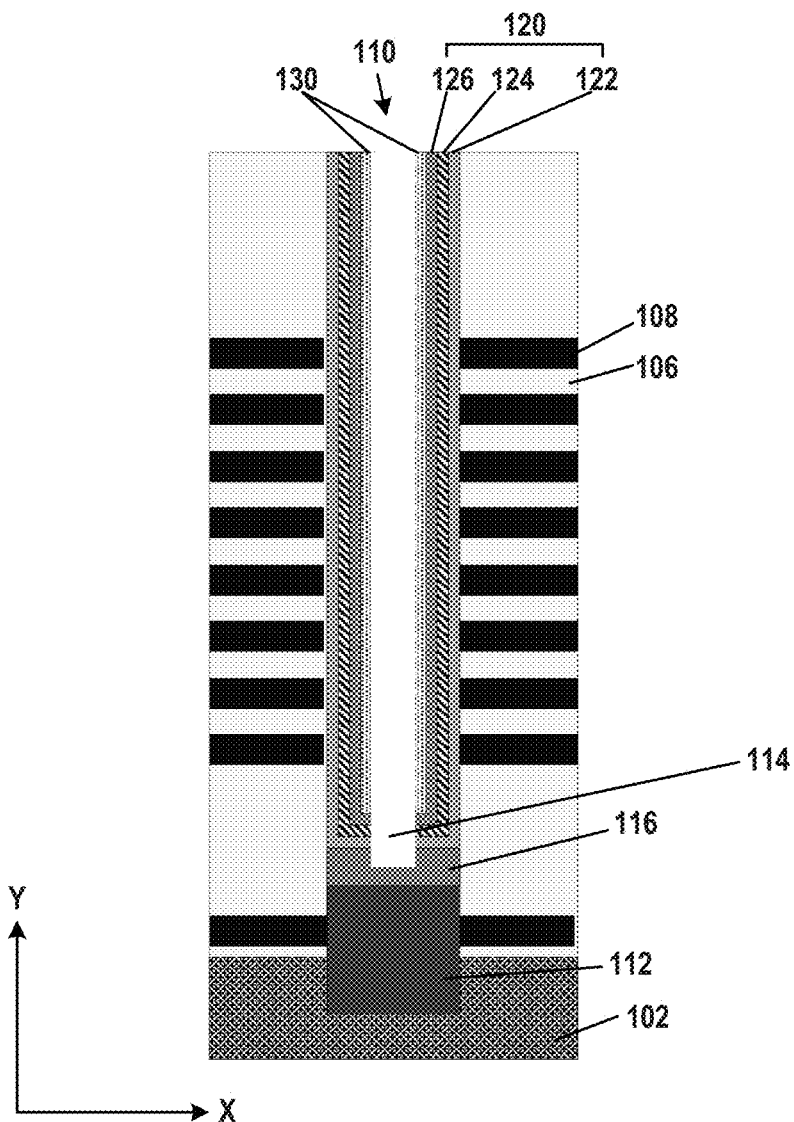
Figure 2F:
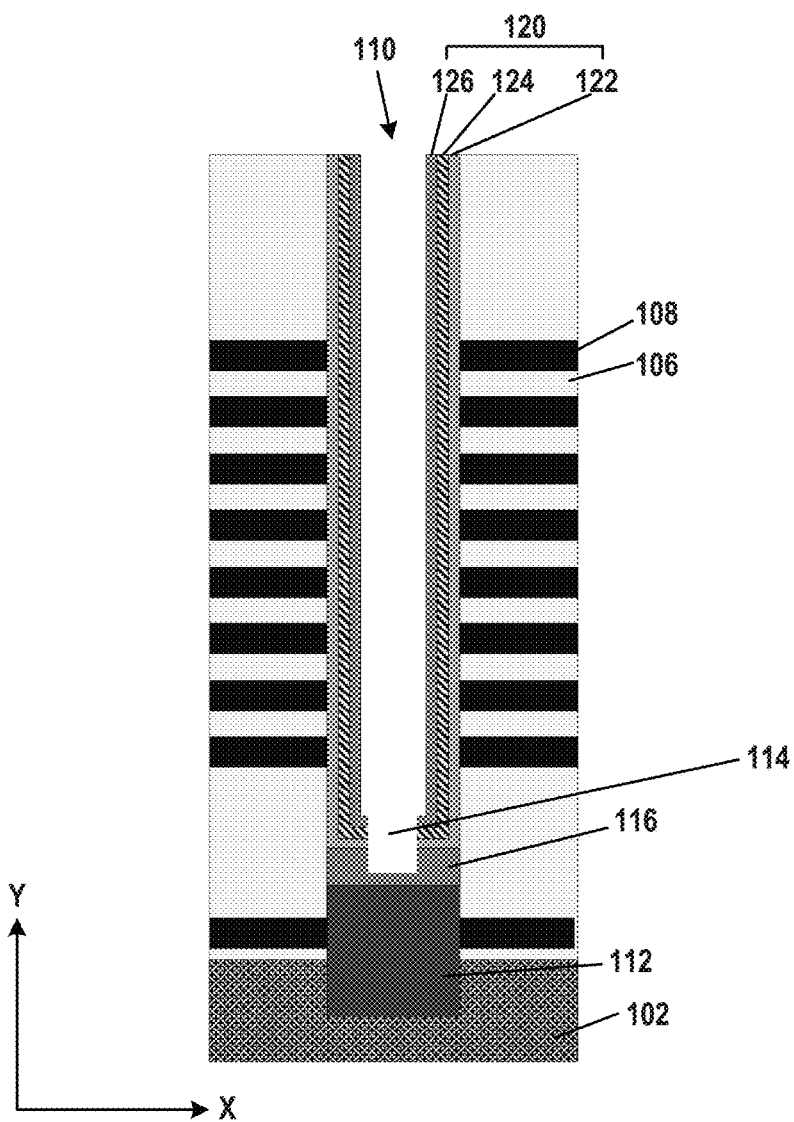
Figure 2G:
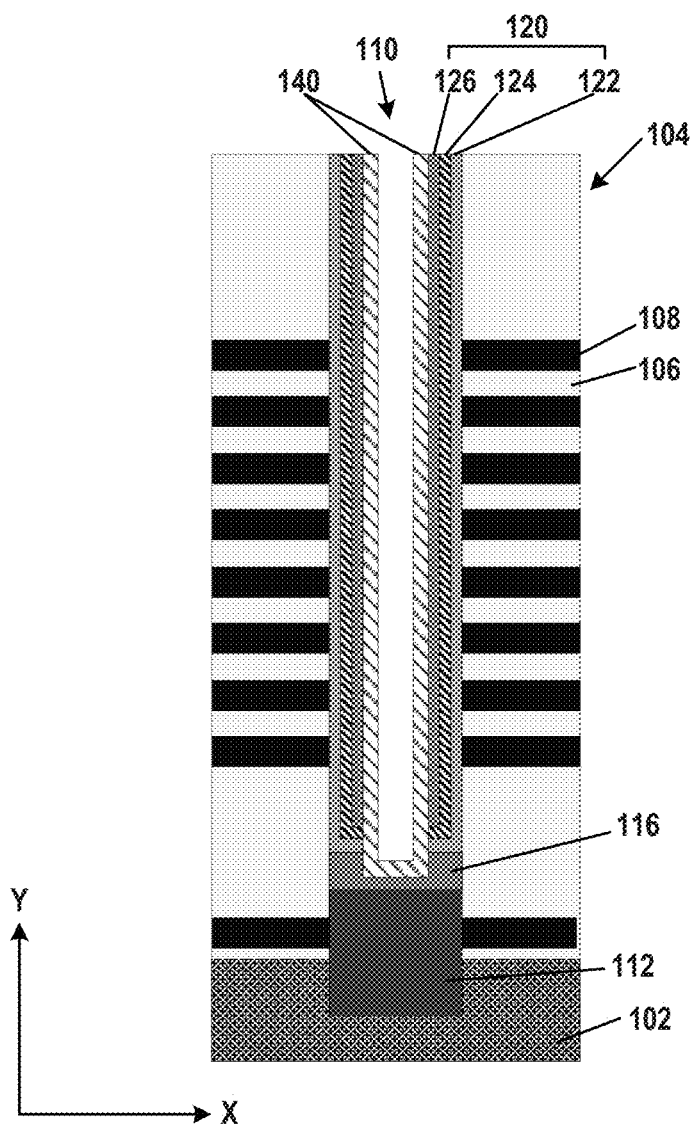
Figure 2H:
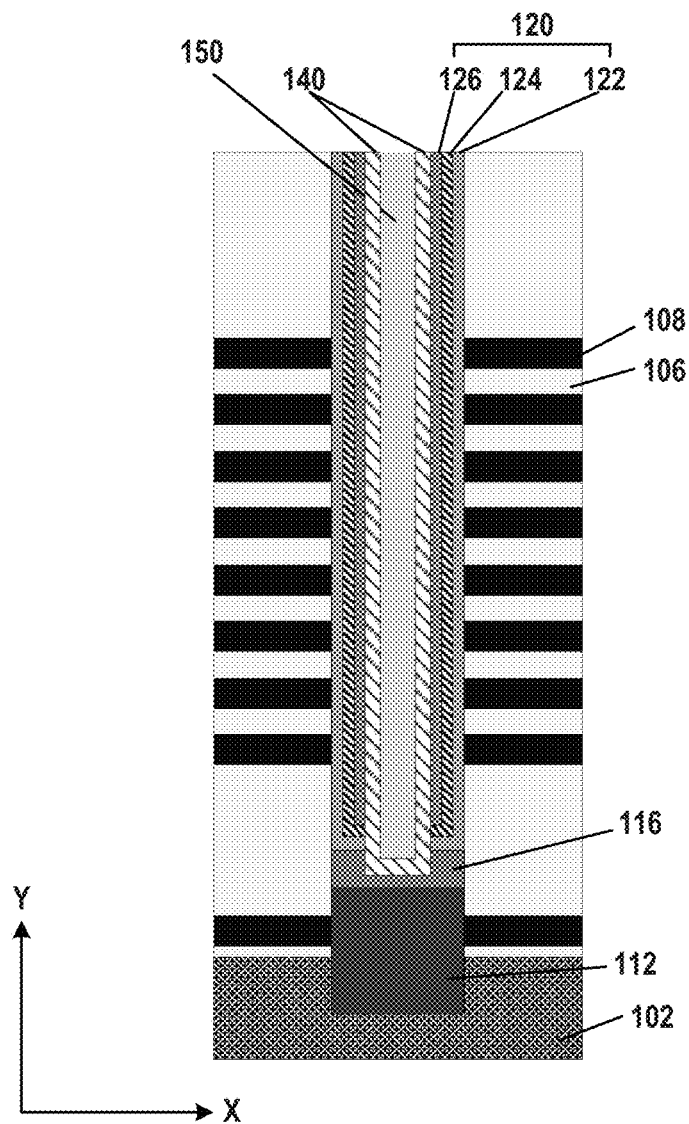

FIGS. 2A-2I illustrate an exemplary fabrication process for forming 3D memory device 100, according to embodiments of the present disclosure. FIGS. 3A and 3B are flowcharts of an exemplary method 300 for forming a 3D memory device having an etch-resistant layer for reducing material loss in a semiconductor plug, according to some embodiments of the present disclosure. In the following, FIGS. 2A-2I, 3A, and 3B will be described together. It is understood that the operations shown in FIGS. 3A and 3B are not exhaustive and that other operations can be performed as well before, after, or between any of the illustrated operations. Further, some of the operations may be performed simultaneously, or in a different order than shown in FIGS. 3A and 3B.

Referring to FIG. 3A, method 300 starts at operation 310, in which a dielectric stack is formed on a substrate. The dielectric stack can include a plurality of interleaved dielectric layers and sacrificial layers. As illustrated in FIG. 2A, a dielectric stack 104 including interleaved first dielectric layers 106 and second dielectric layers (known as "sacrificial layers") 108 are formed on a substrate 102. Dielectric layers 106 and sacrificial layers 108 can be alternatively deposited on substrate 102 to form dielectric stack 104. In some embodiments, each dielectric layer 106 includes a layer of silicon oxide, and each sacrificial layer 108 includes a layer of silicon nitride. Dielectric stack 104 can be formed by one or more thin film deposition processes including, but not limited to, chemical vapor deposition (CVD), physical vapor deposition (PVD), atomic layer deposition (ALD), or any combination thereof. Substrate 102 may include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, wet/dry etching, chemical mechanical polishing (CMP), or any combination thereof.

Method 300 proceeds to operation 320, as illustrated in FIG. 3A, in which an opening extending vertically through the dielectric stack is formed. As illustrated in FIG. 2B, an opening 110 (channel hole) is formed extending vertically through dielectric stack 104. In some embodiments, a plurality of openings 110 are formed through dielectric stack 104 such that each opening 110 becomes the location for forming an individual memory string in later processes. In some embodiments, fabrication processes to form opening 110 include wet etching and/or dry etching, such as deep-ion reactive etching (DRIE). As shown in FIG. 2B, the etching process may proceed through dielectric stack 104 until reaching substrate 102. For example, opening 110 may extend into substrate 102. In another example, the etching process may be stopped before reaching substrate 102 and a subsequent punching process may be performed to further extend opening 110 to substrate 102.

Referring back to FIG. 3A, method 300 proceeds to operation 330, in which a semiconductor plug is formed at a lower portion of the opening. For example, the semiconductor plug may be an SEG plug formed through a selective epitaxial growth process, in which a semiconductor layer is epitaxially grown from the substrate in the opening. As illustrated in FIG. 2C, a semiconductor plug 112 (e.g., an SEG plug) can be formed by filling the lower portion of opening 110 with a semiconductor material, such as silicon or silicon-germanium (SiGe), which is epitaxially grown from substrate 102. The fabrication processes for epitaxially growing semiconductor plug 112 can include, but not limited to, vapor-phase epitaxy (VPE), liquid-phase epitaxy (LPE), molecular-beam epitaxy (MPE), or any combinations thereof.

In some embodiments, the semiconductor material forming semiconductor plug 112 may include SiGe. For example, germanium may be added to silicon during the epitaxial growth process when the temperature is decreased to about 800 C degrees. Using SiGe as the semiconductor material of semiconductor plug 112 can increase the carrier (e.g., electron) mobility, thereby enhancing the performance of the 3D memory device.

Referring back to FIG. 3A, method 300 proceeds to operation 340, in which an etch-resistant layer is formed at a top portion of the semiconductor plug. Referring back to FIG. 2C, the top portion 116 of semiconductor plug 112 may be doped with an etch-resistant material, such as carbon, to form the etch-resistant layer 116. Carbon can provide tensile stress, causing strains in the doped portion of semiconductor plug 112. The strained portion can thus withstand etching far better than silicon or SiGe, lowering the etch rate at etch-resistant layer 116. In some embodiments, portion 116 may be doped with the etch-resistant material through an implanting process. For example, carbon can be implanted into portion 116 to form the etch-resistant layer.

Method 300 proceeds to operation 350, as illustrated in FIG. 3A, in which a channel structure is formed in contact with the etch-resistant layer of the semiconductor plug in the opening. In some embodiments, the channel structure may include a memory film and a semiconductor channel. The memory film may be formed along the sidewall of the opening above the semiconductor plug. The semiconductor channel may be formed inside the space surrounded by the memory film, extending vertically along the sidewall of the memory film.

Operation 350 may include a plurality of sub-operations, shown as sub-operations 351-356 in FIG. 3B. Referring to FIG. 3B, operation 350 starts with sub-operation 351, in which a memory film is formed along the sidewall of the opening above the semiconductor plug. As illustrated in FIG. 2D, fabrication processes of forming a channel structure can include forming a memory film 120 deposited along the sidewall of opening 110 above semiconductor plug 112 (e.g., above etch-resistant layer 116). Memory film 120 can be a composite dielectric layer, such as a combination of a tunneling layer 126, a storage layer 124, and a blocking layer 122. Each layer in memory film 120 can include dielectric materials including, but not limited to, silicon oxide, silicon nitride, silicon oxynitride, or any combination thereof. Memory film 120 can be formed by one or more thin film deposition processes, such as ALD, CVD, PVD, any other suitable processes, or any combination thereof.

Referring back to FIG. 3B, operation 350 proceeds to sub-operation 352, in which an amorphous silicon (A-Si) layer is deposited along the sidewall of the memory film. As illustrated in FIG. 2D, A-Si layer 130 is formed over memory film 120 and long the sidewall of memory film 120. A-Si layer 130 can function as a protective layer in later processes to protect memory film from being etched away and may be removed ("sacrificed") before forming the semiconductor channel. Thus, A-Si layer 130 is also referred to as a protective layer and/or sacrificial A-Si layer.

Referring back to FIG. 3B, operation 350 proceeds to sub-operation 353, in which an etching process is performed to etch through the A-Si layer and the memory film to reach the etch-resistant layer. As illustrated in FIG. 2E, an opening 114 is formed by the etching process. Opening 114 extends through the bottom portions of A-Si layer 130 and memory film 120 and exposes etch-resistant layer 116. In some embodiments, a dry etching process may be performed to form opening 114. During the etching process, a portion of A-Si layer 130 deposited over on the sidewall of memory film 120 may also be removed.

Referring back to FIG. 3B, operation 350 proceeds to sub-operation 354, in which a remaining portion of the A-Si layer is removed. As illustrated in FIG. 2F, the remaining portion of A-Si layer 130 may be removed through a wet etching process. For example, etching solutions such as ammonium hydroxide ($NH_4OH$) may be used to remove A-Si. During this etching process, etch-resistant layer 116 can withstand the etching such that no significant material loss occurs in the etch-resistant layer. For example, the etch rate of the remaining portion of the A-Si layer may be at least 30 times higher than the etch rate of etch-resistant layer 116 during the etching process. In another example, when $NH_4OH$ is used as the etching solution, the etch rate of etch-resistant layer 116 is less than 3 nanometer per minute under room temperature during the etching process. It is noted that any material can be used for doping in semiconductor plug 112 to form etch-resistant layer 116, so long as the etch rate of the resulting etch-resistant layer is significantly lower than the etch rate of A-Si (e.g., at least 30 times slower or less than 3 nanometer per minute with respect to $NH_4OH$ under room temperature). Etch-resistant layer 116 can prevent the etching process from etching through the etch-resistant layer, thereby preventing significant material loss in semiconductor plug 112.

Referring back to FIG. 3B, operation 350 proceeds to sub-operation 355, in which a polysilicon layer is deposited along the sidewall of the memory film to form a semiconductor channel. As illustrated in FIG. 2G, a polysilicon layer 140 can be deposited over and along the sidewall of memory film 120. Polysilicon layer 140 may reach etch-resistant layer 116, the top portion of semiconductor plug 112. In some embodiments, polysilicon layer 140 may extend into etch-resistant layer 116, but not through etch-resistant layer 116 to reach the lower portion of semiconductor plug 112 (e.g., the portion that is not doped with the etch-resistant material). Polysilicon layer 140 may form a semiconductor channel as part of the memory string extending through the dielectric stack 104.

Referring back to FIG. 3B, operation 350 proceeds to sub-operation 356, in which a dielectric material (e.g., silicon oxide) is deposited along the sidewall of the polysilicon layer. As illustrated in FIG. 2H, dielectric material 150 may be deposited to fill the remaining space of opening 110 (e.g., shown in FIG. 2G). Dielectric material 150 may function as a supporting structure to support the memory string and improve stability.

Referring back to FIG. 3A, method 300 proceeds to operation 360, in which a memory stack is formed by replacing the sacrificial layers in the dielectric stack with conductor layers. The memory stack thus can include interleaved conductor layers and dielectric layers. In some embodiments, to form the memory stack, a slit is formed through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers.

Figure 2I:
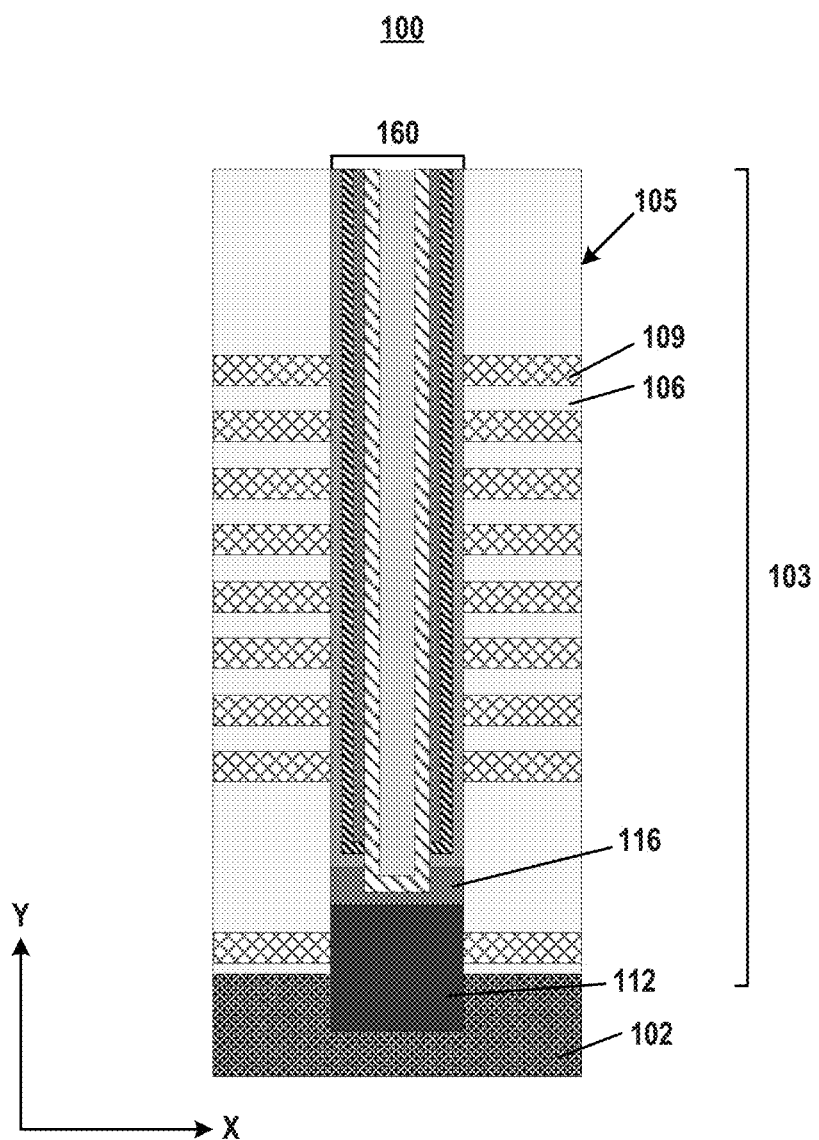
Figure 3A:
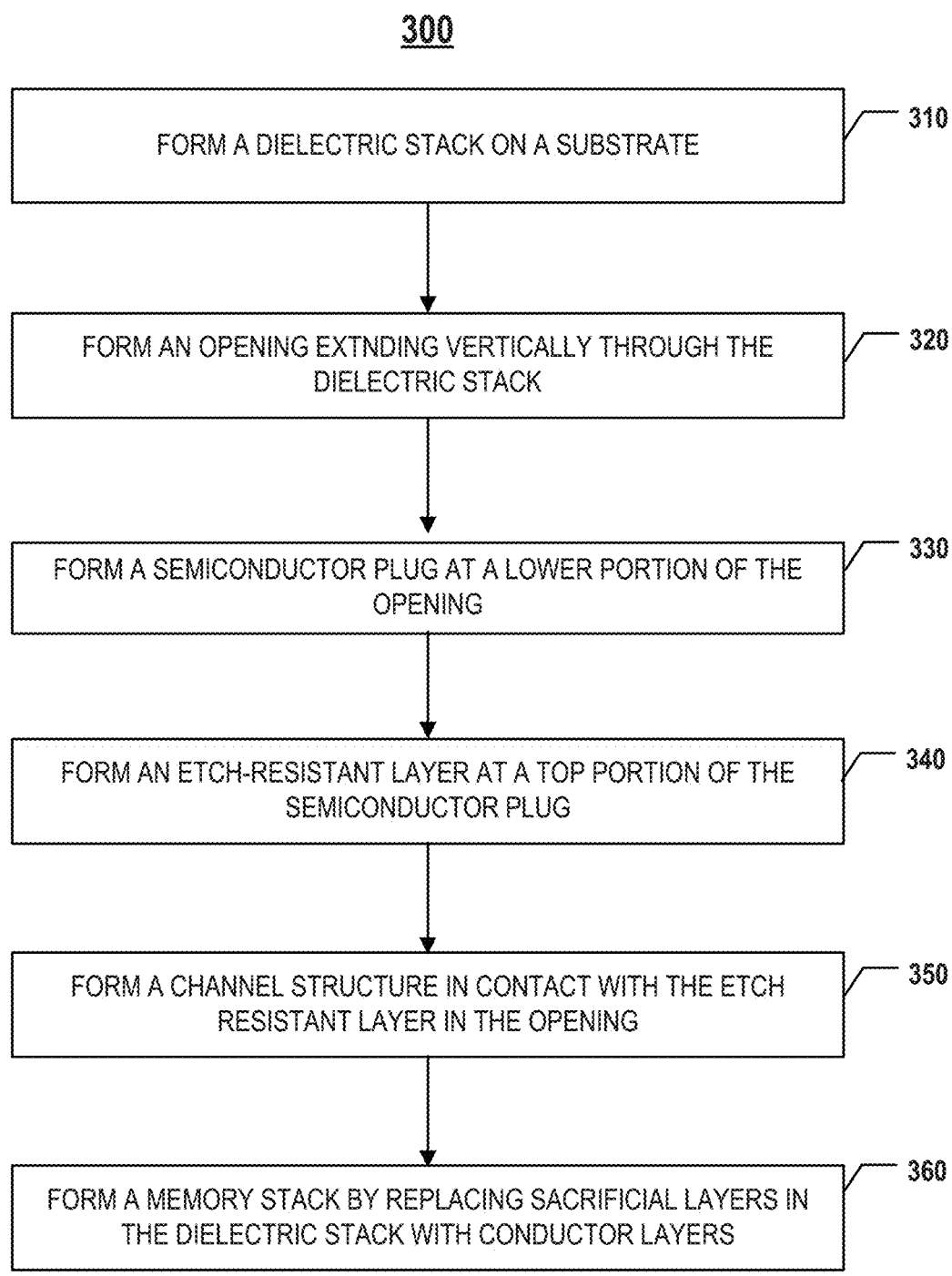
FIGS. 3A and 3B are flowcharts of an exemplary method for forming a 3D memory device having an etch-resistant layer for reducing material loss in a semiconductor plug, according to some embodiments of the present disclosure.
Figure 3B:
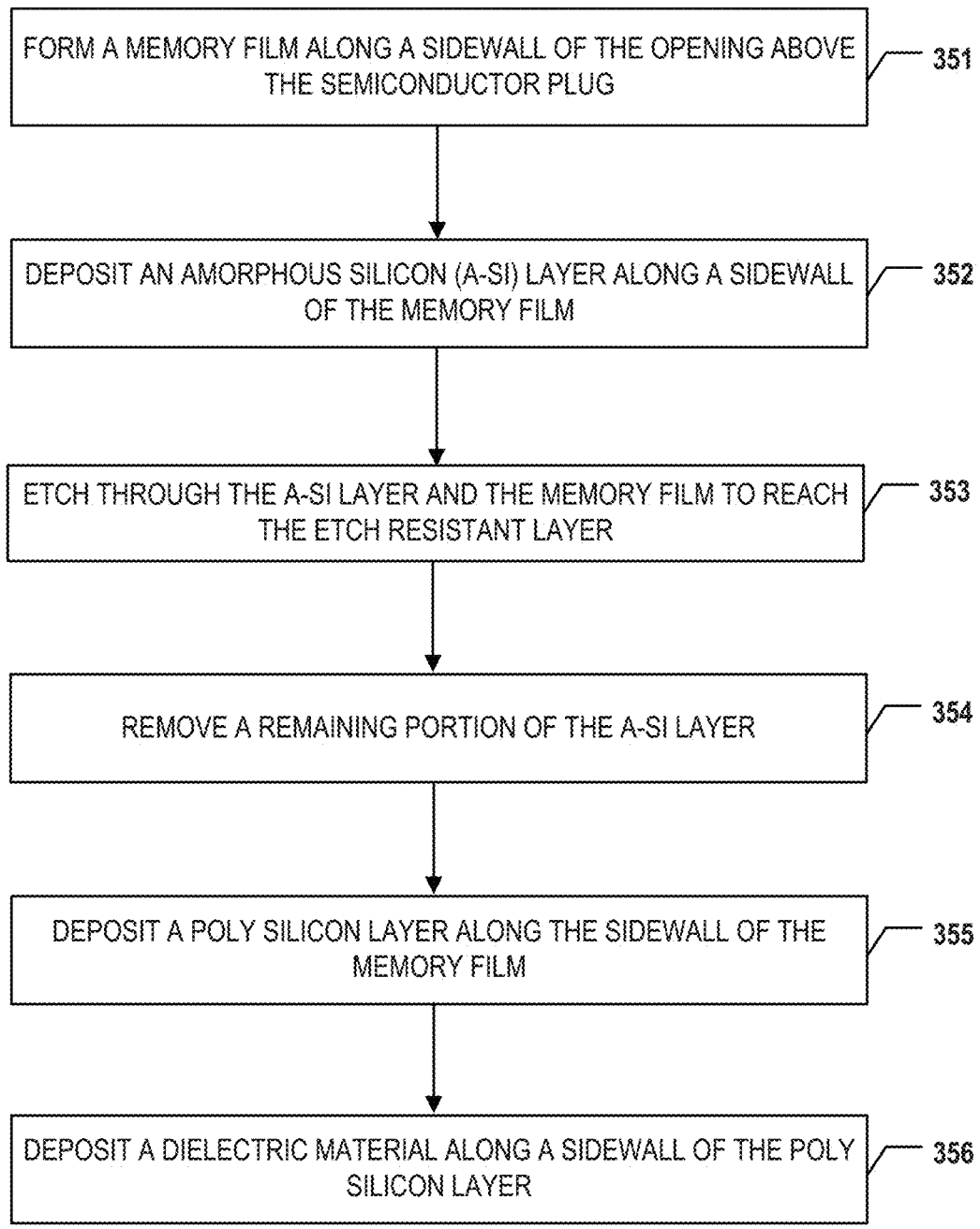

As illustrated in FIG. 2I, sacrificial layers 108 are replaced by conductor layers 109. As a result, a memory stack 105 can be formed. Conductor layers 109 can include conductive materials including, not limited to, W, Co, Cu, Al, polysilicon, silicides, or any combination thereof. Memory film 120 (e.g., in FIG. 2H) and the semiconductor channel (e.g., including polysilicon layer 140 and dielectric material 150 in FIG. 2H) collectively form a memory string 160. Memory string 160 and memory stack 105 may form a cell stack 103 as a memory unit of 3D memory device 100, which may be a NAND Flash memory device.

In some embodiments, cell stack 103 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of memory array device (e.g., NAND memory strings) is constrained by the thermal budget associated with the peripheral devices that have been formed or to be formed on the same substrate.

Alternatively, cell stack 103 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., any suitable digital, analog, and/or mixed-signal peripheral circuits used for facilitating the operation of cell stack 103, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

It should be understood that the application of an etch-resistant layer for reducing material loss in a semiconductor plug is not limited to a 3D memory device only. A more generic device can be any semiconductor structure having a semiconductor plug.

According to an aspect of the present disclosure, a 3D memory device is provided. The memory device includes a substrate and a memory stack disposed on the substrate. The memory stack includes a plurality of interleaved conductor layers and dielectric layers. The memory device further includes a plurality of memory strings each extending vertically through the memory stack and including a semiconductor plug at a bottom portion of the memory string. The semiconductor plug is in contact with the substrate and includes a top portion doped with an etch-resistant material.

In some embodiments, the semiconductor plug is a selective epitaxial growth (SEG) plug.

In some embodiments, the semiconductor plug includes silicon-germanium (SiGe).

In some embodiments, the semiconductor plug comprises silicon.

In some embodiments, the etch-resistant materials includes carbon.

In some embodiments, an etch rate of amorphous silicon (A-Si) is at least 30 times higher than an etch rate of the top portion doped with the etch-resistant material during an etching process.

In some embodiments, an etch rate of the top portion doped with the etch-resistant material is less than 3 nanometer per minute during an etching process using ammonium hydroxide ($NH_4OH$) as an etching solution.

In some embodiments, the etch-resistant material is implanted into the top portion of the semiconductor plug.

In some embodiments, each of the memory strings further includes a semiconductor channel extending vertically through the interleaved conductor layers and dielectric layers.

In some embodiments, each of the memory strings further includes a memory film disposed laterally between the semiconductor channel and the interleaved conductor layers and dielectric layers.

According to another aspect of the present disclosure, a method for forming a 3D memory device is disclosed. The method includes forming a dielectric stack on a substrate. The dielectric stack includes a plurality of interleaved dielectric layers and sacrificial layers. The method also includes forming an opening extending vertically through the dielectric stack to reach the substrate. The method further includes forming a semiconductor plug at a lower portion of the opening. The semiconductor plug is in contact with the substrate. The method also includes forming an etch-resistant layer at a top portion of the semiconductor plug. In addition, the method includes forming a channel structure in the opening. The channel structure is in contact with the etch-resistant layer of the semiconductor plug. Moreover, the method includes forming a memory stack including a plurality of interleaved dielectric layers and conductor layers by replacing the sacrificial layers in the dielectric stack with the conductor layers.

In some embodiments, to form the semiconductor plug, a semiconductor layer epitaxially grown from the substrate in the opening.

In some embodiments, the semiconductor layer includes silicon.

In some embodiments, the semiconductor layer includes silicon-germanium (SiGe).

In some embodiments, to form the etch-resistant layer, carbon is implanted into the top portion of the semiconductor plug.

In some embodiments, to form the channel structure, a memory film is formed along a sidewall of the opening above the semiconductor plug.

In some embodiments, to forming the channel structure, an amorphous silicon (A-Si) layer is deposited along a sidewall of the memory film.

In some embodiments, to form the channel structure, the A-Si layer and the memory film are etched through to reach the etch-resistant layer of the semiconductor plug.

In some embodiments, to form the channel structure, a remaining portion of the A-Si layer is removed through an etching process.

In some embodiments, an etch rate of the remaining portion of the A-Si layer is at least 30 times higher than an etch rate of the etch-resistant layer during the etching process.

In some embodiments, the etching process is performed using ammonium hydroxide ($NH_4OH$) and an etch rate of the etch-resistant layer is less than 3 nanometer per minute during the etching process.

In some embodiments, the etch-resistant layer prevents the etching process from etching through the etch-resistant layer.

In some embodiments, to form the channel structure, a polysilicon layer is deposited along the sidewall of the memory film after removing the remaining portion of the A-Si layer.

In some embodiments, the polysilicon layer extends into the etch-resistant layer.

In some embodiments, to form the channel structure, a dielectric material is deposited along a sidewall of the polysilicon layer.

In some embodiments, the substrate includes silicon and the sacrificial layers include silicon nitride.

According to still another aspect of the present disclosure, a method for forming a semiconductor structure is provided. The method includes forming a plurality of interleaved dielectric layers and sacrificial layers on a substrate. The method also includes forming an opening extending vertically through the interleaved dielectric layers and sacrificial layers. The method further includes forming a semiconductor plug at a lower portion of the opening. The semiconductor plug is in contact with the substrate. In addition, the method includes doping a top portion of the semiconductor plug with an etch-resistant material. Moreover, the method includes forming a channel structure in the opening. The channel structure extends into the top portion of the semiconductor plug.

In some embodiments, to form the semiconductor plug, a semiconductor layer is epitaxially grown from the substrate in the opening.

In some embodiments, the semiconductor layer includes silicon.

In some embodiments, the semiconductor layer includes silicon-germanium (SiGe).

In some embodiments, the etch-resistant material includes carbon.

In some embodiments, to dope the top portion of the semiconductor plug, carbon is implanted into the top portion of the semiconductor plug.

In some embodiments, to form the channel structure, a memory film is formed along a sidewall of the opening above the semiconductor plug.

In some embodiments, to form the channel structure, an amorphous silicon (A-Si) layer is deposited along a sidewall of the memory film.

In some embodiments, to form the channel structure, the A-Si layer and the memory film are etched through to reach the top portion of the semiconductor plug doped with the etch-resistant material.

In some embodiments, to form the channel structure, a remaining portion of the A-Si layer is removed through an etching process.

In some embodiments, an etch rate of the remaining portion of the A-Si layer is at least 30 times higher than an etch rate of the top portion of the semiconductor plug doped with the etch-resistant material during the etching process.

In some embodiments, the etching process is performed using ammonium hydroxide ($NH_4OH$) and an etch rate of the top portion of the semiconductor plug doped with the etch-resistant material is less than 3 nanometer per minute during the etching process.

In some embodiments, the top portion of the semiconductor plug doped with the etch-resistant material prevents the etching process from etching therethrough.

In some embodiments, to form the channel structure, a polysilicon layer is deposited along the sidewall of the memory film after removing the remaining portion of the A-Si layer.

In some embodiments, to form the channel structure, a dielectric material is deposited along a sidewall of the polysilicon layer.

In some embodiments, the substrate includes silicon and the sacrificial layers include silicon nitride.

In some embodiments, to forming a memory stack, a plurality of interleaved dielectric layers and conductor layers are formed by replacing the sacrificial layers with the conductor layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack disposed on the substrate, the memory stack comprising a plurality of interleaved conductor layers and dielectric layers; and
a plurality of memory strings each extending vertically through the memory stack and comprising a semiconductor plug at a bottom portion of the memory string, wherein the semiconductor plug is in contact with the substrate and comprises a top portion doped with an etch-resistant material.

2. The memory device of claim 1, wherein the semiconductor plug is a selective epitaxial growth (SEG) plug.

3. The memory device of claim 1, wherein the semiconductor plug comprises silicon-germanium (SiGe).

4. The memory device of claim 1, wherein the semiconductor plug comprises silicon.

5. The memory device of claim 1, wherein the etch-resistant material comprises carbon.

6. The memory device of claim 1, wherein an etch rate of amorphous silicon (A-Si) is at least 30 times higher than an etch rate of the top portion doped with the etch-resistant material during an etching process.

7. The memory device of claim 1, wherein an etch rate of the top portion doped with the etch-resistant material is less than 3 nanometer per minute during an etching process using ammonium hydroxide ($NH_4OH$) as an etching solution.

8. The memory device of claim 1, wherein the etch-resistant material is implanted into the top portion of the semiconductor plug.

9. The memory device of claim 1, wherein each of the memory strings further comprises:
a semiconductor channel extending vertically through the interleaved conductor layers and dielectric layers.

10. The memory device of claim 9, wherein each of the memory strings further comprises:
a memory film disposed laterally between the semiconductor channel and the interleaved conductor layers and dielectric layers.

11. A method for forming a three-dimensional (3D) memory device, comprising:
forming a dielectric stack on a substrate, the dielectric stack comprising a plurality of interleaved dielectric layers and sacrificial layers;
forming an opening extending vertically through the dielectric stack to reach the substrate;
forming a semiconductor plug at a lower portion of the opening, wherein the semiconductor plug is in contact with the substrate;
forming an etch-resistant layer at a top portion of the semiconductor plug;
forming a channel structure in the opening, wherein the channel structure is in contact with the etch-resistant layer of the semiconductor plug; and
forming a memory stack comprising a plurality of interleaved dielectric layers and conductor layers by replacing the sacrificial layers in the dielectric stack with the conductor layers.

12. The method of claim 11, wherein forming the etch-resistant layer comprises implanting carbon into the top portion of the semiconductor plug.

13. The method of claim 11, wherein forming the channel structure comprises forming a memory film along a sidewall of the opening above the semiconductor plug.

14. The method of claim 13, wherein forming the channel structure further comprising:

depositing an amorphous silicon (A-Si) layer along a sidewall of the memory film.

15. The method of claim 14, wherein forming the channel structure further comprising:
etching through the A-Si layer and the memory film to reach the etch-resistant layer of the semiconductor plug.

16. The method of claim 15, wherein forming the channel structure further comprising:
removing a remaining portion of the A-Si layer through an etching process.

17. The method of claim 16, wherein an etch rate of the remaining portion of the A-Si layer is at least 30 times higher than an etch rate of the etch-resistant layer during the etching process.

18. The method of claim 16, wherein:
the etching process is performed using ammonium hydroxide ($NH_4OH$); and
an etch rate of the etch-resistant layer is less than 3 nanometer per minute during the etching process.

19. A method for forming a semiconductor structure, comprising:
forming a plurality of interleaved dielectric layers and sacrificial layers on a substrate;
forming an opening extending vertically through the interleaved dielectric layers and sacrificial layers;
forming a semiconductor plug at a lower portion of the opening, wherein the semiconductor plug is in contact with the substrate;
doping a top portion of the semiconductor plug with an etch-resistant material; and
forming a channel structure in the opening, wherein the channel structure extends into the top portion of the semiconductor plug.

20. The method of claim 19, wherein doping the top portion of the semiconductor plug comprises implanting carbon into the top portion of the semiconductor plug.

* * * * *